(12) United States Patent
Moacanin et al.

(10) Patent No.: US 7,260,753 B2
(45) Date of Patent: Aug. 21, 2007

(54) METHODS AND APPARATUS FOR PROVIDING TEST ACCESS TO ASYNCHRONOUS CIRCUITS AND SYSTEMS

(75) Inventors: Michel A. Moacanin, Somis, CA (US); Jeremy Boulton, Pasadena, CA (US); Steven Novak, Agoura Hills, CA (US)

(73) Assignee: Fulcrum Microsystems, Inc., Calabasas, CA (US)

( * ) Notice: Subject to any disclaimer, the term of this patent is extended or adjusted under 35 U.S.C. 154(b) by 858 days.

(21) Appl. No.: 10/628,074

(22) Filed: Jul. 25, 2003

(65) Prior Publication Data

US 2005/0013356 A1    Jan. 20, 2005

Related U.S. Application Data

(60) Provisional application No. 60/487,535, filed on Jul. 14, 2003.

(51) Int. Cl.
*G01R 31/28* (2006.01)
*H03L 7/00* (2006.01)

(52) U.S. Cl. ...................... 714/724; 327/145
(58) Field of Classification Search ............... None
See application file for complete search history.

(56) References Cited

U.S. PATENT DOCUMENTS

| | | | |
|---|---|---|---|
| 4,680,701 A | 7/1987 | Cochran | |
| 4,875,224 A | 10/1989 | Simpson | |
| 4,912,348 A | 3/1990 | Maki et al. | |
| 5,367,638 A | 11/1994 | Niessen et al. | |
| 5,434,520 A | 7/1995 | Yetter et al. | |
| 5,440,182 A | 8/1995 | Dobbelaere | |

(Continued)

FOREIGN PATENT DOCUMENTS

WO    WO9207361    4/1992

OTHER PUBLICATIONS

"Low-power synchronous-to-asynchronous- to-synchronous interlocked pipelined CMOS circuits operating at 3.3-4.5 GHz" by Schuster et al. This paper appears in: IEEE Journal of Solid-State Circuits Publication Date: Apr. 2003 vol. 38, Issue: 4 On pp. 622-630 ISSN: 0018-9200 INSPEC Accession No. 7565233.*

(Continued)

*Primary Examiner*—Cynthia Britt
(74) *Attorney, Agent, or Firm*—Beyer Weaver LLP

(57) ABSTRACT

Methods and apparatus are described for providing test access by synchronous test equipment to an asynchronous circuit. Synchronous-to-asynchronous (S2A) conversion circuitry is operable to receive synchronous input data serially from the synchronous test equipment and convert the synchronous input data to asynchronous input data. Asynchronous logic is operable to transmit the asynchronous input data to a first test register in the asynchronous circuit, and to transmit asynchronous output data received from a second test register in the asynchronous circuit. The asynchronous output data results from application of the asynchronous input data to the asynchronous circuit. Operation of the asynchronous logic is synchronized at least in part with a clock signal associated with the synchronous test equipment. Asynchronous-to-synchronous (A2S) conversion circuitry is operable to receive the asynchronous output data from the asynchronous logic, convert the asynchronous output data to synchronous output data, and serially transmit the synchronous output data to the synchronous test equipment.

28 Claims, 5 Drawing Sheets

U.S. PATENT DOCUMENTS

| | | | |
|---|---|---|---|
| 5,479,107 | A | 12/1995 | Knauer |
| 5,572,690 | A | 11/1996 | Molnar |
| 5,666,532 | A | 9/1997 | Saks et al. |
| 5,732,233 | A | 3/1998 | Klim et al. |
| 5,752,070 | A | 5/1998 | Martin et al. |
| 5,802,331 | A | 9/1998 | Van Berkel |
| 5,832,303 | A | 11/1998 | Murase et al. |
| 5,889,979 | A | 3/1999 | Miller, Jr. et al. |
| 5,900,753 | A * | 5/1999 | Cote et al. .................. 327/145 |
| 5,918,042 | A | 6/1999 | Furber |
| 5,920,899 | A | 7/1999 | Chu |
| 5,949,259 | A | 9/1999 | Garcia |
| 5,958,077 | A * | 9/1999 | Banerjee et al. ............ 714/738 |
| 5,973,512 | A | 10/1999 | Baker |
| 6,038,656 | A | 3/2000 | Martin et al. |
| 6,044,061 | A | 3/2000 | Aybay et al. |
| 6,152,613 | A | 11/2000 | Martin et al. |
| 6,301,655 | B1 | 10/2001 | Martin et al. |
| 6,381,692 | B1 | 4/2002 | Martin et al. |
| 6,502,180 | B1 | 12/2002 | Martin et al. |
| 6,807,644 | B2 * | 10/2004 | Reis et al. .................. 714/724 |
| 6,848,060 | B2 * | 1/2005 | Cook et al. ................. 713/400 |
| 6,980,943 | B2 * | 12/2005 | Aitken et al. ................. 703/14 |
| 7,007,215 | B2 * | 2/2006 | Kinoshita et al. ........... 714/745 |
| 7,058,535 | B2 * | 6/2006 | Chenoweth et al. ........ 702/118 |
| 2002/0152046 | A1 * | 10/2002 | Velichko et al. ............ 702/117 |

OTHER PUBLICATIONS

IBM TDB: NN8607813 "Method to Synchronize an Asynchronous IBM Series/1 Interface to Allow Testing on a Synchronous Tester" IBM Technical Disclosure Bulletin, Jul. 1986, US Vol. 29, Issue: 2 p. 813-815 Publication Date: Jul. 1, 1986 (19860701).*

Andrew Matthew Lines, *Pipelined Asynchronous Circuits*, Jun. 1995, revised Jun. 1998, pp. 1-37.

Alain J. Martin, *Compiling Communicating Processes into Delay-Insensitive VLSI Circuits*, Dec. 31, 1985, Department of Computer Science California Institute of Technology, Pasadena, California, pp. 1-16.

Alain J. Martin, *Erratum: Synthesis of Asynchronous VLSI Circuits*, Mar. 22, 2000, Department of Computer Science California Institute of Technology, Pasadena, California, pp. 1-143.

U.V. Cummings, et al. *An Asynchronous Pipelined Lattice Structure Filter*, Department of Computer Science California Institute of Technology, Pasadena, California, pp. 1-8.

Alain J. Martin, et al. *The Design of an Asynchronous MIPS R3000 Microprocessor*, Department of Computer Science California Institute of Technology, Pasadena, California, pp. 1-18.

C.L. Seitz, *System Timing*, chapter 7, pp. 218-262.

F.U. Rosemberger et al., *Internally Clocked Delay-Insensitive Modules*, IEEE Trans., Computers, vol. 37, No. 9, pp. 1005-1018, Sep. 1998.

U.S. Appl. No. 09/501,638, filed on Feb. 10, 2000, entitled, *Reshuffled Communications Processes in Pipelined Asynchronous Circuits*.

Lee et al., *Crossbar-Based Gigabit Packet Switch with an Input-Polling Shared Bus Arbitration Mechanism*, Sep. 21, 1997, XVI World Telecom Congress Proceedings, Interactive Session 3—Systems Technology & Engineering, pp. 435-441.

Ghosh et al., *Distributed Control Schemes for Fast Arbitration in Large Crossbar Networks*, Mar. 1994, IEEE Transactions on Very Large Scale Integration (VLSI) Systems, vol. 2, No. 1, pp. 55-67.

Venkat et al., "Timing Verification of Dynamic Circuits", May 1, 1995, IEEE 1995 Custom Integrated Circuits Conference.

Wilson, "Fulcrum IC heats asynchronous design debate", Aug. 20, 2002, http://www.fulcrummicro.com/press/article_eeTimes_08-20-02.shtml.

Martin, "Asynchronous Datapaths and the Design of an Asynchronous Adder", Department of Computer Science California Institute of Technology, Pasadena, California, pp. 1-24.

Martin, "Self-Timed FIFO: An Exercise in Compiling Programs into VLSI Circuit", Computer Science Department California Institute of Technology, pp. 1-21.

* cited by examiner

METHODS AND APPARATUS FOR PROVIDING TEST ACCESS TO ASYNCHRONOUS CIRCUITS AND SYSTEMS

RELATED APPLICATION DATA

The present application claims priority from U.S. Provisional Patent Application entitled METHODS AND APPARATUS FOR PROVIDING TEST ACCESS TO ASYNCHRONOUS CIRCUITS AND SYSTEM filed on Jul. 14, 2003, Ser. No. 60/487,535 the entire disclosure of which is incorporated herein by reference for all purposes.

BACKGROUND OF THE INVENTION

The present invention relates to asynchronous digital circuit design and in particular to the testing of asynchronous circuits and systems.

The ever increasing demand for simultaneously faster and more complex digital circuits, e.g., microprocessors, has pushed conventional digital circuit design methodologies to their limits. Because of the combination of high clock rates (i.e., greater than 100 MHz) and design complexity (e.g., very large scale integration (VLSI) devices with 10 million or more transistors), signal propagation delay has become a dominant design consideration. It has become clear that a significant design paradigm shift will be necessary if digital circuit design is to continue its historical adherence to Moore's law.

Asynchronous VLSI is an active area of research and development in digital circuit design. It refers to all forms of digital circuit design in which there is no global clock synchronization signal. Delay-insensitive asynchronous designs, by their very nature are insensitive to the signal propagation delays which have become the single greatest obstacle to the advancement of traditional design paradigms. That is, delay-insensitive circuit design maintains the property that any transition in the digital circuit could have an unbounded delay and the circuit will still behave correctly. The circuits enforce sequencing but not absolute timing. This design style avoids design and verification difficulties that arise from timing assumptions, glitches, or race conditions.

Generally speaking, synchronous design styles are facing serious performance limitations. Certain asynchronous design methodologies also have difficulties with some of the same types of limitations, e.g., race conditions. By contrast, the delay-insensitive branch of asynchronous digital design, because of its relative immunity to these limitations, appears to hold great promise for supporting future advancements in the performance of digital circuits.

However, even if such asynchronous digital design techniques are to be the digital design methodology which enables the performance of digital circuits and systems to continue to improve in accordance with historical norms, the testing of such circuits will likely need to be done using synchronous test equipment for some time to come. That is, virtually all of the commercially available and currently installed base of test equipment is synchronous in nature. As is well known, such test equipment is employed with a variety of standard interfaces, e.g., JTAG and scan interfaces, to facilitate access to (via boundary scans) and verification of synchronous circuit designs using, for example, one or more scan chains.

Because asynchronous designs do not typically employ clock signals, the application of test vectors and the reading of results using conventional synchronous test equipment is not straightforward. It is therefore desirable to provide circuits and techniques for facilitating test access to the internal signal nodes of asynchronous designs using conventional synchronous test equipment.

SUMMARY OF THE INVENTION

According to the present invention, methods and apparatus are provided for facilitating conversion back and forth between a serial bit stream in a synchronous domain and a message-based protocol in an asynchronous domain. Specific implementations of these methods and apparatus are particularly useful for facilitating the testing of asynchronous circuits and systems using conventional synchronous test equipment and protocols.

According to various specific embodiments, the present invention provides methods and apparatus for providing test access by synchronous test equipment to an asynchronous circuit. Synchronous-to-asynchronous (S2A) conversion circuitry is operable to receive synchronous input data serially from the synchronous test equipment and convert the synchronous input data to asynchronous input data. Asynchronous logic is operable to transmit the asynchronous input data to a first test register in the asynchronous circuit, and to transmit asynchronous output data received from a second test register in the asynchronous circuit. The asynchronous output data results from application of the asynchronous input data to the asynchronous circuit. Operation of the asynchronous logic is synchronized at least in part with a clock signal associated with the synchronous test equipment. Asynchronous-to-synchronous (A2S) conversion circuitry is operable to receive the asynchronous output data from the asynchronous logic, convert the asynchronous output data to synchronous output data, and serially transmit the synchronous output data to the synchronous test equipment.

A further understanding of the nature and advantages of the present invention may be realized by reference to the remaining portions of the specification and the drawings.

DETAILED DESCRIPTION OF SPECIFIC EMBODIMENTS

Figure 1:
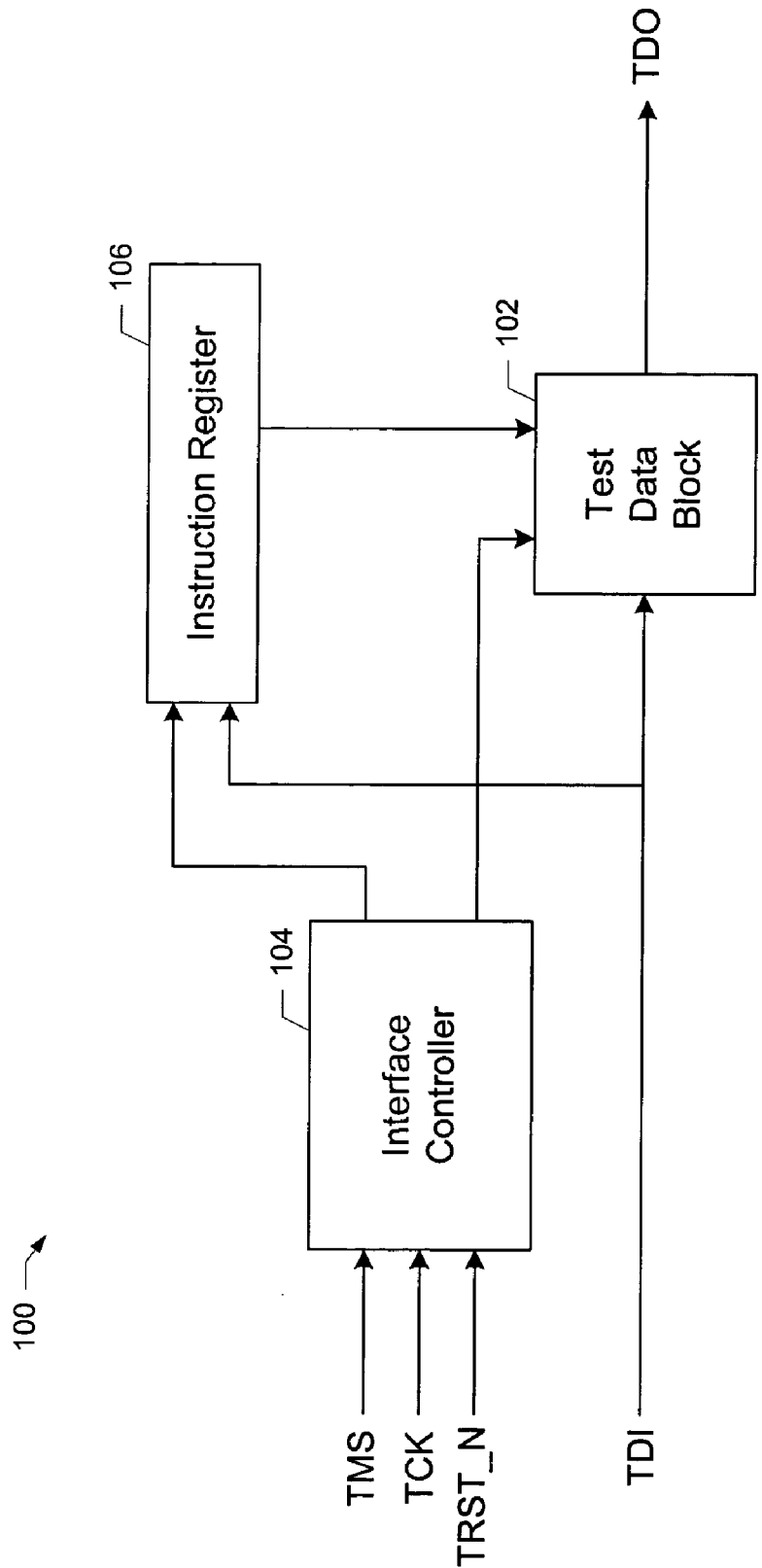
FIG. 1 is a block diagram of a serial interface between a synchronous domain and an asynchronous domain designed according to a specific embodiment of the invention.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known process operations have not been described in detail in order not to unnecessarily obscure the present invention.

It should also be noted that specific embodiments of the invention are described in the context of a design style relating to quasi-delay-insensitive asynchronous VLSI circuits. However it will be understood that many of the principles and techniques of the invention may be used in other contexts such as, for example, non-delay insensitive asynchronous VLSI as well as synchronous VLSI.

According to various specific embodiments, the asynchronous design style employed in conjunction with the invention is characterized by the latching of data in channels instead of registers. Such channels implement a FIFO (first-in-first-out) transfer of data from a sending circuit to a receiving circuit. Data wires run from the sender to the receiver, and an enable (i.e., an inverted sense of an acknowledge) wire goes backward for flow control. According to specific ones of these embodiments, a four-phase handshake between neighboring circuits (processes) implements a channel. The four phases are in order: 1) Sender waits for high enable, then sets data valid; 2) Receiver waits for valid data, then lowers enable; 3) Sender waits for low enable, then sets data neutral; and 4) Receiver waits for neutral data, then raises enable. It should be noted that the use of this handshake protocol is for illustrative purposes and that therefore the scope of the invention should not be so limited.

According to other aspects of this design style, data are encoded using 1ofN encoding or so-called "one hot encoding." This is a well known convention of selecting one of N+1 states with N wires. The channel is in its neutral state when all the wires are inactive. When the kth wire is active and all others are inactive, the channel is in its kth state. It is an error condition for more than one wire to be active at any given time. For example, in certain embodiments, the encoding of data is dual rail, also called 1 of2. In this encoding, 2 wires (rails) are used to represent 2 valid states and a neutral state. According to other embodiments, larger integers are encoded by more wires, as in a 1 of3 or 1 of4 code. For much larger numbers, multiple 1 ofN's may be used together with different numerical significance. For example, 32 bits can be represented by 32 1 of2 codes or 16 1 of4 codes.

In some cases, the above-mentioned asynchronous design style may employ the pseudo-code language CSP (concurrent sequential processes) to describe high-level algorithms and circuit behavior. CSP is typically used in parallel programming software projects and in delay-insensitive VLSI. Applied to hardware processes, CSP is sometimes known as CHP (for Communicating Hardware Processes). For a description of this language, please refer to "Synthesis of Asynchronous VLSI Circuits," by A. J. Martin, DARPA Order number 6202. 1991, the entirety of which is incorporated herein by reference for all purposes.

The transformation of CSP specifications to transistor level implementations for use with various techniques described herein may be achieved according to the techniques described in "Pipelined Asynchronous Circuits" by A. M. Lines, *Caltech Computer Science Technical Report* CS-TR-95-21, Caltech, 1995, the entire disclosure of which is incorporated herein by reference for all purposes. However, it should be understood that any of a wide variety of asynchronous design techniques may also be used for this purpose.

According to various embodiments of the invention, test access is provided to asynchronous circuits and systems (such as those designed according to the design paradigm described above) such that conventional synchronous test equipment may be employed to test such circuits and systems. FIG. 1 is a block diagram illustrating a serial test interface 100 designed according to one such embodiment. Serial test interface 100 may be implemented on an asynchronous integrated circuit with the circuit(s) to be tested. It may also be implemented as a subsystem of a purely asynchronous system having multiple subsystems, or, alternatively, as part of a hybrid synchronous/asynchronous system. In the specific embodiment shown, the interface is compliant with the Joint Test Action Group (JTAG) standard, i.e., IEEE Standard Test Access Port and Boundary Scan Architecture, IEEE 1149.1-2001, the entire disclosure of which is incorporated herein by reference for all purposes. Thus, from the perspective of the synchronous domain, i.e., the test equipment, the depicted embodiment behaves like a conventional JTAG interface. According to a particular implementation, a number of standard JTAG instructions are supported including, for example, IDCODE, SAMPLE/PRELOAD, EXTEST, HIGHZ, CLAMP, and BYPASS.

Serial interface 100 connects a series of data registers in test data block 102 between the serial input (TDI) and serial output (TDO) pins. The nature of each of these various registers will be discussed below. The selection of which register is to be connected between TDI and TDO is controlled by an interface controller 104 and an instruction register 106. That is, interface controller 104 selects instruction register 106 and a new instruction is shifted into instruction register 106 via the TDI input. This instruction selects for a particular one of the data registers in test data block 102 to be placed into the serial data stream for any of a variety of operations including, for example, the loading of test data into the data register from the TDI input, the loading of test results into the data register from the circuit or system being tested, and the shifting of the test results out of the data register onto the TDO output.

According to a specific embodiment, interface controller 104 comprises a finite state machine (FSM) the state of which is controlled by inputs TMS (test mode select), TCK (synchronous domain clock), and $TRST_{13}N$ (interface reset signal). In general, except where specified, system inputs are valid on the positive edge of TCK, and outputs are valid on the negative edge of TCK. According to a more specific embodiment, interface controller FSM has 16 states, relevant ones of which will be described in more detail below. As will also be described in greater detail, the output of interface controller to test data block 102 and instruction register 106 depends on the current state of the FSM.

As stated above, test data block 102 includes a plurality of data registers. Some of these registers correspond to conventional synchronous domain JTAG data registers (e.g., a bypass register, a boundary scan register, a device identification register). According to a specific embodiment of the invention, test data block 102 also includes one or more serial tree registers which, as will be described, provides a mechanism by which the synchronous domain test equipment can communicate with an asynchronous domain circuit or system.

Figure 2:
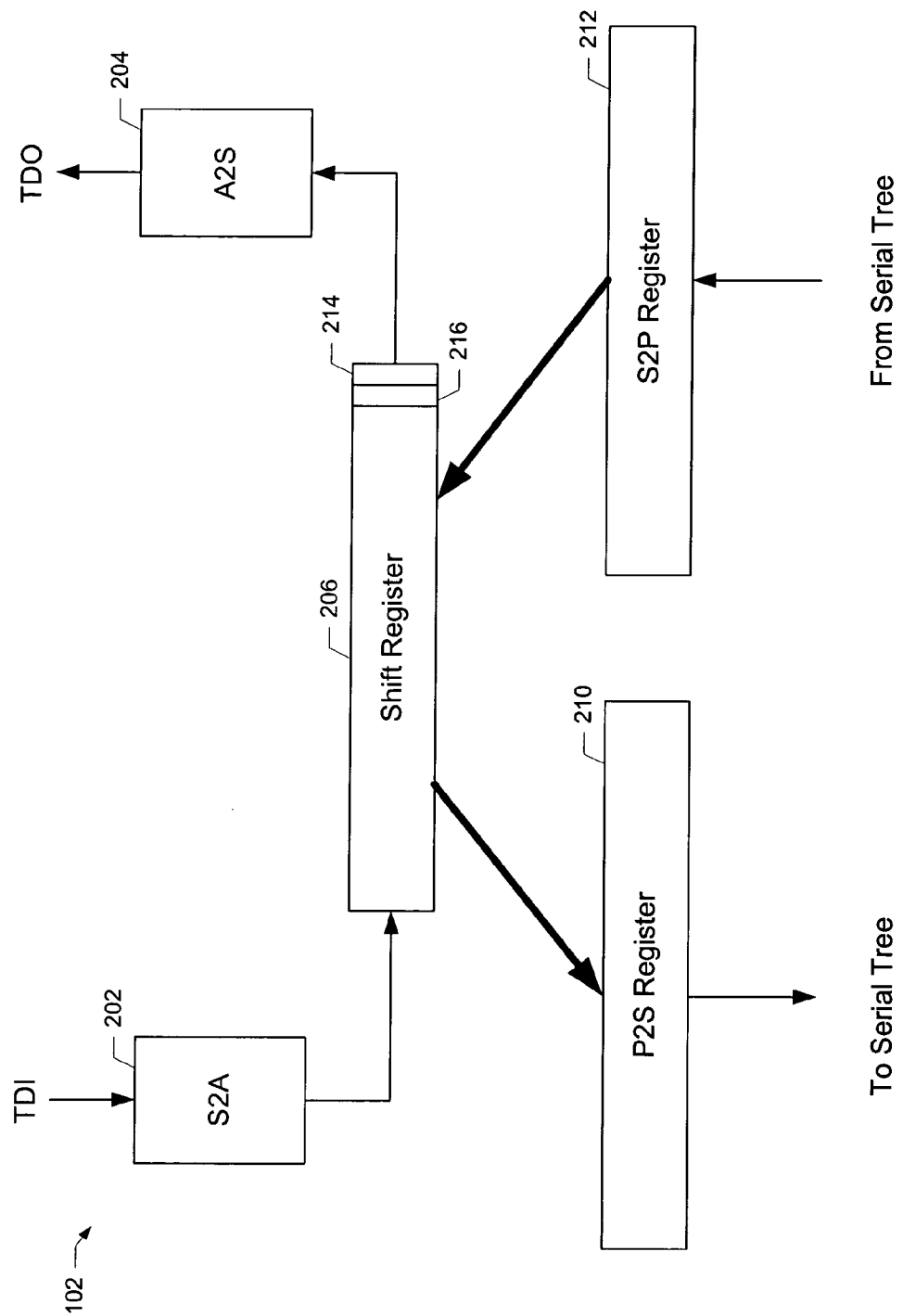
FIG. 2 is a block diagram of a serial tree register for use with the serial interface of FIG. 1.

FIG. 2 is a block diagram of a particular implementation of such a serial tree register 200. Once register 200 is selected under control of the interface controller and the instruction register, a synchronous-to-asynchronous (S2A) conversion interface 202 receives test data in (TDI) from the synchronous domain and converts them to asynchronous TDI. Another asynchronous-to-synchronous (A2S) conversion interface 204 receives test data out (TDO) from the asynchronous domain and converts them to synchronous TDI. According to various embodiments, any of a variety of S2A and A2S interfaces may be employed to effect conversion of signals between the two domains. According to a specific embodiment, these interfaces are implemented as described in commonly assigned, copending U.S. patent application Ser. No. 10/212,574 entitled TECHNIQUES FOR FACILITATING CONVERSION BETWEEN ASYNCHRONOUS AND SYNCHRONOUS DOMAINS filed on Aug. 1, 2002, the entire disclosure of which is incorporated herein by reference for all purposes.

The S2A and A2S interfaces are coupled to an asynchronous shift register 206 which receives the TDI from S2A interface 202, transmits the TDI to a parallel-to-serial (P2S) serial tree output register 210, receives asynchronous TDO from a serial-to-parallel (S2P) serial tree input register 212, and transmits the TDO to A2S interface 204. P2S register 210 receives parallel TDI from shift register 206, and transmits the TDI serially to a serial tree interface (not shown) which transmits the TDI to their destination within the circuit or system being tested. S2P register 212 receives serial TDO from a second serial tree interface (not shown) which is an inverted version of the first serial tree interface, and transmits the TDO in parallel to shift register 206.

Figure 3:
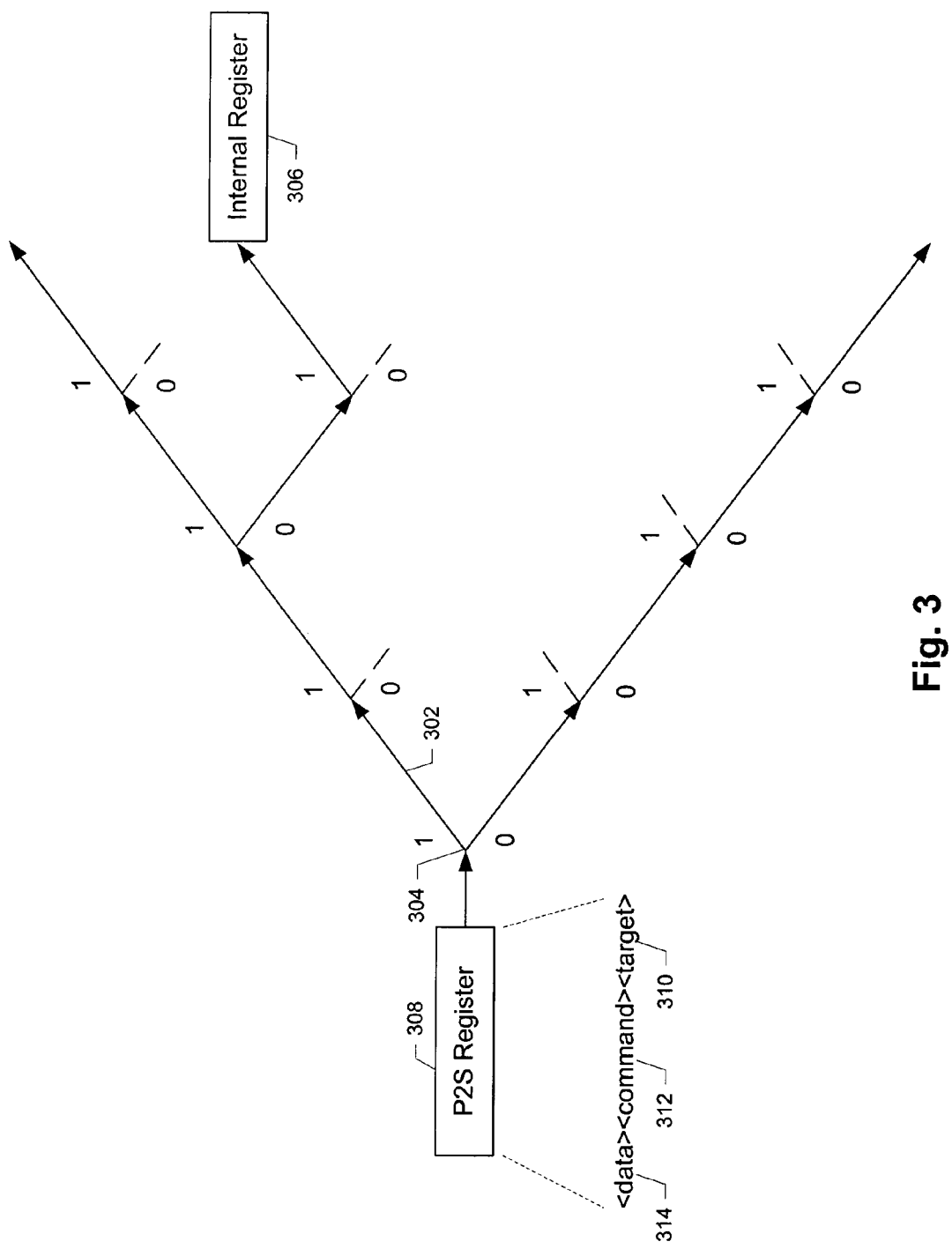
FIG. 3 is a simplified diagram of a serial tree interface.

The serial tree interfaces in this context are functional equivalents of scan chains corresponding to conventional synchronous data registers in that they enable test data to be transmitted to and received from a set of internal nodes or registers in the circuit/system being tested. As illustrated in FIG. 3, an exemplary serial tree 300 includes a series of links 302 and forks 304 which route serial data to any of a variety of test registers 306 which might correspond, for example, to a segment of RAM. The links extending from each fork represent either a "0" or a "1." That is, one routing bit in the target field is consumed at each fork and the data are sent to either the "0" channel or the "1" channel corresponding to that fork, but not both. According to a specific embodiment, each link comprises a 1 of 3 asynchronous channel which employs the four-phase handshake described above, and each fork represents circuitry which is operable to route the input data stream to one of multiple possible output channels according to the routing information.

A parallel-to-serial (P2S) register 308 is coupled to the input of the serial tree. The value in P2S register 308 includes a target field 310 identifying the test node or register to which the data are directed, a command field 312 indicating the operation to be performed (e.g., read or write), and a data field 314 which carries data (if any) to be written to the target register.

From lowest to highest, each bit in target field 310 determines which link or branch of tree 300 is to be taken. For example, for the target field value "1011," the lowest order bit is a "1" resulting in the corresponding link be taken at the first fork. This bit is stripped off, resulting in another "1" being the lowest order bit. The link at the next fork is then determined based on that bit, and so on, until the target is reached. An inverted serial tree of similar construction is employed to get data out of the circuit. In this way, test data in (TDI) are moved from the P2S register to their target register, and test data out (TDO) are moved to the S2P register.

Figure 4:
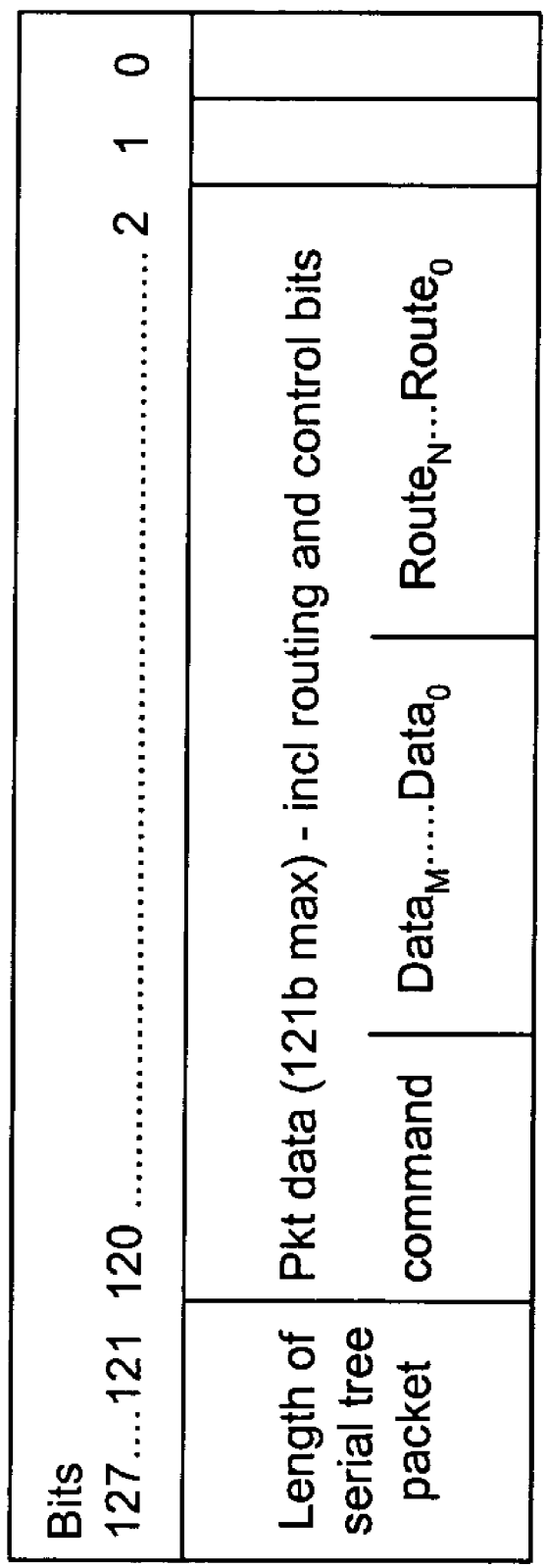
FIG. 4 is an exemplary bit ordering diagram 400 of a test data word for use with a specific embodiment of the present invention.

An exemplary bit ordering diagram 400 of a 128-bit value for use with a specific embodiment of the present invention is shown in FIG. 4. Bits 121-127 represent the length of the variable-length packet. Bits 2-120 are the packet data and include the command field, the data words ($Data_0$-$Data_M$), and routing information ($Route_0$-$Route_N$). Bits 0 and 1 correspond to bits 214 and 216 of FIG. 2, the functionality of which is described below.

It should be noted that, according to various implementations, there may be more than one path in and out of such a serial tree interface. That is, for example, the input from the P2S register may be multiplexed with one or more other registers which may be selected based on the test or access mode desired.

Referring back to FIG. 2, shift register 206 generally performs three functions referred to herein as "capture," "shift," and "update." These operations are similar to conventional JTAG data register operations with appropriate modifications to enable the interfacing of the synchronous and asynchronous domains in a manner transparent to the synchronous domain. In this context, the capture function refers to the operation by which a parallel data word is conditionally transferred from S2P register 212 to shift register 206. The shift function refers to the operation by which shift register 206 serially shifts a data word to A2S interface 204 via the TDO channel. The update function refers to the operation by which a parallel data word is conditionally transferred to P2S register 210 from shift register 206.

The conditional nature of the capture and update transfers relates to the state of two control bits at the end of the data words. This is illustrated in FIG. 2 by the highlighted fields at the right hand end of shift register 206. The lowest order bit 214 relates to capture operations and reflects that valid data are present in S2P register 212 for capture by shift register 206. The next bit 216 relates primarily to update operations and reflects the readiness of the serial tree interface associated with P2S register 210 to accept a data word. As will be understood with reference to the discussion above regarding the handshake protocol, one or more such control bits or some similar mechanism is required due to the asynchronous nature of the serial tree interface and its associated circuitry.

The operation of a serial tree register implemented according to a specific embodiment of the invention, i.e., serial tree register 200 of FIG. 2, will now be described. It should be understood that the specific details shown in FIG. 2 are merely exemplary and that other implementations having similar functionality are contemplated. When the state of the interface controller gets around to loading a data word into the serial tree register, the corresponding serial tree instruction is loaded into the instruction register, e.g., register 106 of FIG. 1, serial tree register 200 is connected to the serial data stream (i.e., between TDI and TDO), and a data word is serially shifted into the serial tree register's shift register 206. Once the data word has been loaded, shift register 206 performs an update operation (if bit 216 is set), and perform a parallel transfer of the data word into P2S register 210 and thus into the serial tree.

A read or write operation will then be performed at some destination node or register accessed via the serial tree, and a result will be returned via the serial tree to S2P register 212. According to a specific embodiment, a result will be returned whether the operation performed is a read or a write; a read operation returning the data word read and a write operation returning a completion word which occupies one entry in the S2P register. When the state of the interface controller returns to the serial tree register, shift register 206 performs a capture operation (if bit 214 is set), and the result data word is transferred in parallel into shift register 206. When the interface controller again reaches the appropriate state, the result data word is then serially shifted out of shift register 206 to the TDO channel during a shift operation which also results in a new input data word being load from the TDI channel.

According to a specific embodiment, because the capture operation in shift register 206 always follows an update operation, the capture command to the shift register is asserted early, i.e., before the interface controller cycles back to that state, the result data word in S2P register 212 is loaded to shift register 206, and a portion of the result data word in shift register 206 is "speculatively" shifted to the TDO channel. This "primes" the A2S interface and is meant to overcome delays associated with the S2A and A2S conversions as well as to deal with timing variations resulting from the asynchronous nature of the serial tree interface. This helps to ensure that data are present on the TDO when the synchronous domain is expecting them to be there.

According to one embodiment, the first two bits of the result data word captured in shift register 206 are speculatively shifted to the A2S interface via the asynchronous TDO channel. The remaining bits of the result data word as well as the first two bits of the new input data word being shifted into shift register 206 from the TDI channel are shifted out to the A2S interface during the following shift operation. Because the last two bits shifted to the TDO channel are part of the new input vector, they are discarded by logic in the A2S interface and do not appear on the synchronous TDO. However, these bits must also be made available for transfer to P2S register 210 on the following update operation. Therefore, according to a specific embodiment, the last two bits shifted from shift register 206 on a shift operation are mirrored or cached in logic associated with the A2S interface. These bits are then merged back into the new input data word when it is transferred from shift register 206 to P2S register 210 on the update operation.

Figure 5:
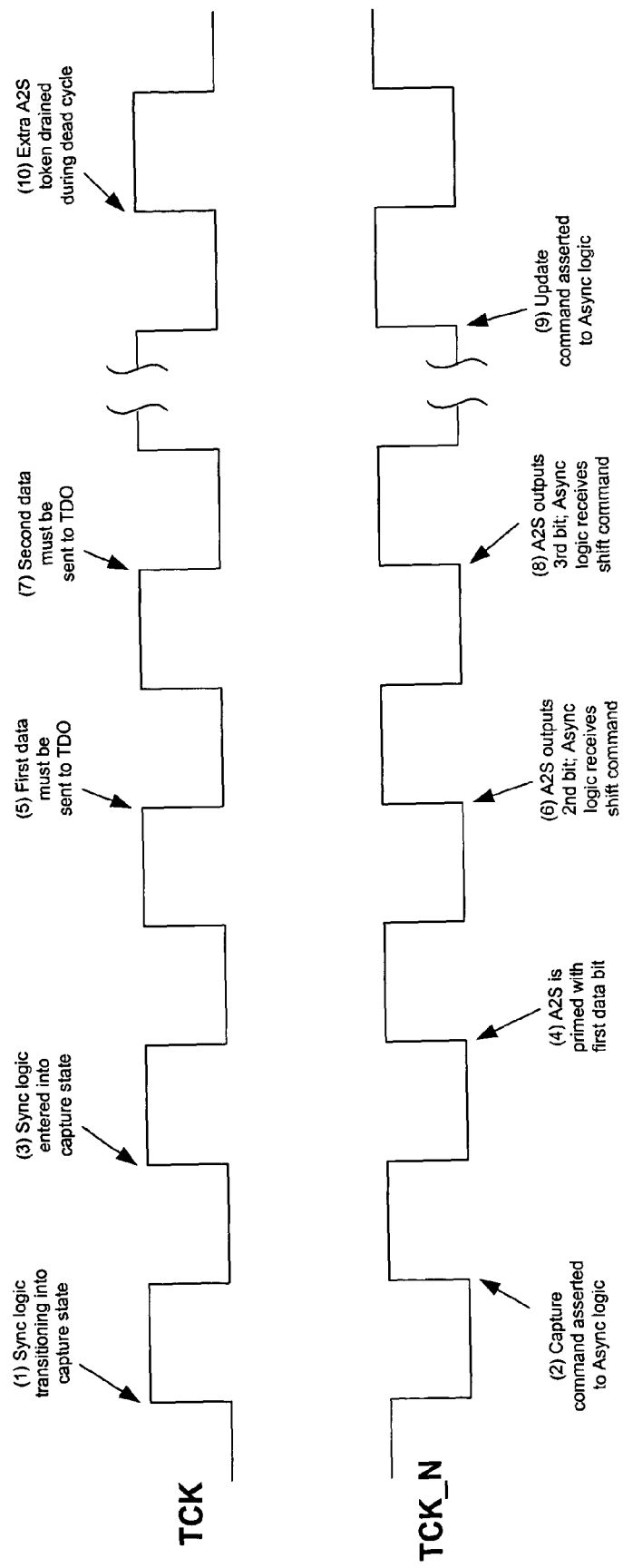
FIG. 5 is simplified timing diagram of a capture/shift/update sequence of operations in a serial interface designed according to a specific embodiment of the invention.

A simplified timing diagram of a capture/shift/update sequence of operations according to a specific embodiment of the invention is shown in FIG. 5. The synchronous clock signal (TCK) and an inverted version (TCK_N) are employed to allow events to be clocked on the negative transitions of the clock. On the first positive transition of TCK, (1), the synchronous logic begins transitioning to the capture state under the control of the interface controller. On the subsequent negative transition of TCK, i.e., the first positive transition of TCK_N shown, (2), the capture command and the instruction register assert signals to the asynchronous logic which are then converted to the serial tree protocol.

On the next positive transition of the clock signal, (3), the transition of the synchronous logic to the capture state is complete. On the subsequent negative transition of the clock, (4), the A2S interface is primed with the first bit of the data word captured in the shift register to meet the requirement that the first data be visible on the TDO pin before transition (5). The A2S interface outputs the second pre-shift bit to the TDO pin at the same time the asynchronous logic receives the shift command for the third bit, (6), and in sufficient time to provide the data to the TDO, (7). The A2S interface outputs the third bit to the TDO pin on the following negative transition of TCK.

This sequence of shifting and outputting of bits to the TDO occurs until the entire contents of the asynchronous shift register have been shifted to the A2S interface (as indicated by the break in the traces), at which point the asynchronous logic receives the update command, (9). On the following positive transition of the clock, (10), and during the idle state (during which the new input test vector is applied to the circuit being tested), the first of the extra bits from the shift register are drained by the A2S interface logic, and on the next rising edge the second bit is drained.

While the invention has been particularly shown and described with reference to specific embodiments thereof, it will be understood by those skilled in the art that changes in the form and details of the disclosed embodiments may be made without departing from the spirit or scope of the invention. For example, as discussed above, embodiments of the present invention may be employed to facilitate access to internal circuitry of asynchronous integrated circuits. It should also be understood that the techniques described herein may be employed on a circuit board on which multiple asynchronous (as well as synchronous) circuits are interconnected to verify the interconnections between the circuits.

In addition, it should be understood that many of the details discussed above relate specifically to emulation of a JTAG-compliant interface for testing asynchronous circuits using an asynchronous serial tree interface which operates in accordance with an enable signal. The specific embodiments described above essentially ensure synchronization of the assertion of the asynchronous enable signal with the clock signal in the synchronous domain, effectively creating a clocked serial tree interface. Thus, a more generalized embodiment within the scope of the invention would be any implementation in which this is achieved. That is, any implementation which employs a virtual clock signal in place of the serial tree enable, and which operates at or below a maximum frequency which guarantees that the virtual clock signal is not asserted before the enable would have been asserted is within the scope of the invention.

It should also be understood that the various embodiments of the invention may be implemented in a wide variety of ways without departing from the scope of the invention. That is, the processes and circuits described herein may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., SPICE netlist), semiconductor processes (e.g., CMOS, GaAs, SiGe, etc.), and device types (e.g., FPGAs) suitable for designing and manufacturing the processes and circuits described herein are within the scope of the invention.

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A test interface for providing test access by synchronous test equipment to an asynchronous circuit, the test interface comprising:

synchronous-to-asynchronous (S2A) conversion circuitry operable to receive synchronous input data serially from the synchronous test equipment and convert the synchronous input data to asynchronous input data;

asynchronous logic operable to transmit the asynchronous input data to a first test register in the asynchronous circuit, and to transmit asynchronous output data received from a second test register in the asynchronous circuit, the asynchronous output data resulting from application of the asynchronous input data to the asynchronous circuit, operation of the asynchronous logic being synchronized at least in part with a clock signal associated with the synchronous test equipment; and asynchronous-to-synchronous (A2S) conversion circuitry operable to receive the asynchronous output data from the asynchronous logic, convert the asynchronous output data to synchronous output data, and serially transmit the synchronous output data to the synchronous test equipment;

wherein the asynchronous logic comprises a shift register which is operable alternately to receive the asynchronous input data serially from the S2A conversion circuitry and transmit the asynchronous output data serially to the A2S conversion circuitry, and wherein the asynchronous logic further comprises a parallel-to-serial (P2S) register operable to receive the asynchronous input data in parallel from the shift register, and transmit the asynchronous input data serially to the first test register.

2. The test interface of claim 1 further comprising a serial tree interface coupled to the P2S register operable to transmit the asynchronous input data to the first test register.

3. The test interface of claim 1 further comprising an interface controller operable to control operation of the asynchronous logic in accordance with the clock signal, wherein the interface controller comprises a finite state machine having a plurality of associated states.

4. The test interface of claim 1 wherein the test interface is part of a JTAG compliant interface.

5. A test interface for providing test access by synchronous test equipment to an asynchronous circuit, the test interface comprising:

synchronous-to-asynchronous (S2A) conversion circuitry operable to receive synchronous input data serially from the synchronous test equipment and convert the synchronous input data to asynchronous input data;

asynchronous logic operable to transmit the asynchronous input data to a first test register in the asynchronous circuit, and to transmit asynchronous output data received from a second test register in the asynchronous circuit, the asynchronous output data resulting from application of the asynchronous input data to the asynchronous circuit, operation of the asynchronous logic being synchronized at least in part with a clock signal associated with the synchronous test equipment; and asynchronous-to-synchronous (A2S) conversion circuitry operable to receive the asynchronous output data from the asynchronous logic, convert the asynchronous output data to synchronous output data, and serially transmit the synchronous output data to the synchronous test equipment;

wherein the asynchronous logic comprises a shift register which is operable alternately to receive the asynchronous input data serially from the S2A conversion circuitry and transmit the asynchronous output data serially to the A2S conversion circuitry, and wherein the asynchronous logic further comprises a serial-to-parallel (S2P) register operable to receive the asynchronous output data serially from the second test register, and transmit the asynchronous output data in parallel to the shift register.

6. The test interface of claim 5 further comprising a serial tree interface coupled to the S2P register operable to transmit the asynchronous output data from the second test register.

7. The test interface of claim 5 further comprising an interface controller operable to control operation of the asynchronous logic in accordance with the clock signal, wherein the interface controller comprises a finite state machine having a plurality of associated states.

8. The test interface of claim 5 wherein the test interface is part of a JTAG compliant interface.

9. A test interface for providing test access by synchronous test equipment to an asynchronous circuit, the test interface comprising:

synchronous-to-asynchronous (S2A) conversion circuitry operable to receive synchronous input data serially from the synchronous test equipment and convert the synchronous input data to asynchronous input data;

asynchronous logic operable to transmit the asynchronous input data to a first test register in the asynchronous circuit, and to transmit asynchronous output data received from a second test register in the asynchronous circuit, the asynchronous output data resulting from application of the asynchronous input data to the asynchronous circuit, operation of the asynchronous logic being synchronized at least in part with a clock signal associated with the synchronous test equipment; and asynchronous-to-synchronous (A2S) conversion circuitry operable to receive the asynchronous output data from the asynchronous logic, convert the asynchronous output data to synchronous output data, and serially transmit the synchronous output data to the synchronous test equipment;

wherein the asynchronous logic comprises a shift register which is operable alternately to receive the asynchronous input data serially from the S2A conversion circuitry and transmit the asynchronous output data serially to the A2S conversion circuitry, and wherein the shift register is operable to perform a plurality of operations including a shift operation for shifting in the asynchronous input data and shifting out the asynchronous output data, an update operation for transmitting the asynchronous input data to the first test register, and a capture operation for receiving the asynchronous output data from the second test register, and wherein the shift register is further operable to begin early shifting out of the asynchronous output data upon reception of the asynchronous output data and before commencement of a subsequent shift operation.

10. The test interface of claim 9 wherein the early shifting and the subsequent shift operation result in a portion of the asynchronous input data being shifted out of the shift register, the A2S conversion circuitry being operable to discard the portion of the asynchronous input data.

11. The test interface of claim 10 wherein the A2S conversion circuitry is further operable to merge the portion of the asynchronous input data with a remainder of the asynchronous input data for transmission to the first test register.

12. The test interface of claim 9 further comprising an interface controller operable to control operation of the asynchronous logic in accordance with the clock signal, wherein the interface controller comprises a finite state machine having a plurality of associated states.

13. The test interface of claim 9 wherein the test interface is part of a JTAG compliant interface.

14. A test interface for providing test access by synchronous test equipment to an asynchronous circuit, the test interface comprising:
synchronous-to-asynchronous (S2A) conversion circuitry operable to receive synchronous input data serially from the synchronous test equipment and convert the synchronous input data to asynchronous input data;
asynchronous logic operable to transmit the asynchronous input data to a first test register in the asynchronous circuit, and to transmit asynchronous output data received from a second test register in the asynchronous circuit, the asynchronous output data resulting from application of the asynchronous input data to the asynchronous circuit, operation of the asynchronous logic being synchronized at least in part with a clock signal associated with the synchronous test equipment; and
asynchronous-to-synchronous (A2S) conversion circuitry operable to receive the asynchronous output data from the asynchronous logic, convert the asynchronous output data to synchronous output data, and serially transmit the synchronous output data to the synchronous test equipment;
wherein the asynchronous logic comprises a shift register which is operable alternately to receive the asynchronous input data serially from the S2A conversion circuitry and transmit the asynchronous output data serially to the A2S conversion circuitry, and wherein the shift register is operable to perform a plurality of operations including a shift operation for shifting in the asynchronous input data and shifting out the asynchronous output data, an update operation for transmitting the asynchronous input data to the first test register, and a capture operation for receiving the asynchronous output data from the second test register, and wherein the shift register is operable to transmit the asynchronous input data in response to a control bit in the asynchronous input data indicating readiness of an interface associated with the first test register to receive the asynchronous input data.

15. The test interface of claim 14 further comprising an interface controller operable to control operation of the asynchronous logic in accordance with the clock signal, wherein the interface controller comprises a finite state machine having a plurality of associated states.

16. The test interface of claim 14 wherein the test interface is part of a JTAG compliant interface.

17. A test interface for providing test access by synchronous test equipment to an asynchronous circuit, the test interface comprising:
synchronous-to-asynchronous (S2A) conversion circuitry operable to receive synchronous input data serially from the synchronous test equipment and convert the synchronous input data to asynchronous input data;
asynchronous logic operable to transmit the asynchronous input data to a first test register in the asynchronous circuit, and to transmit asynchronous output data received from a second test register in the asynchronous circuit, the asynchronous output data resulting from application of the asynchronous input data to the asynchronous circuit, operation of the asynchronous logic being synchronized at least in part with a clock signal associated with the synchronous test equipment; and
asynchronous-to-synchronous (A2S) conversion circuitry operable to receive the asynchronous output data from the asynchronous logic, convert the asynchronous output data to synchronous output data, and serially transmit the synchronous output data to the synchronous test equipment;
wherein the asynchronous logic comprises a shift register which is operable alternately to receive the asynchronous input data serially from the S2A conversion circuitry and transmit the asynchronous output data serially to the A2S conversion circuitry, and wherein the shift register is operable to perform a plurality of operations including a shift operation for shifting in the asynchronous input data and shifting out the asynchronous output data, an update operation for transmitting the asynchronous input data to the first test register, and a capture operation for receiving the asynchronous output data from the second test register, and wherein the shift register is operable to receive the asynchronous output data in response to a control bit in the asynchronous output data indicating validity of the asynchronous output data.

18. The test interface of claim 17 further comprising an interface controller operable to control operation of the asynchronous logic in accordance with the clock signal, wherein the interface controller comprises a finite state machine having a plurality of associated states.

19. The test interface of claim 17 wherein the test interface is part of a JTAG compliant interface.

20. A method for testing an asynchronous circuit using synchronous test equipment, comprising:
converting synchronous input data received from the synchronous test equipment to asynchronous input data;
transmitting the asynchronous input data to a first test register in the asynchronous ciricut;
receiving asynchronous output data from a second test register in the asynchronous circuit, the asynchronous output data resulting from application of the asynchronous input data to the asynchronous circuit; and
converting the asynchronous output data to synchronous output data; and
serially transmitting the synchronous output data to the synchronous test equipment;
wherein transmission and reception of the asynchronous input and output data are synchronized at least in part with a clock signal associated with the synchronous test equipment, and wherein transmitting the asynchronous input data to the first test register comprises receiving the asynchronous input data with a shift register, and wherein receiving the asynchronous output data from a second test register comprises receiving the asynchronous output data with the shift register, and wherein transmitting the asynchronous input data to the first test register further comprises transmitting the asynchronous input data in parallel from the shift register to a parallel-to-serial (P2S) register, and transmitting the asynchronous input data serially from the P2S register to the first test register.

21. The method of claim 20 wherein transmitting the asynchronous input data serially from the P2S register to the first test register is done via a serial tree interface coupled between the P2S register and the first test register.

22. A method for testing an asynchronous circuit using synchronous test equipment, comprising:
   converting synchronous input data received from the synchronous test equipment to asynchronous input data;
   transmitting the asynchronous input data to a first test register in the asynchronous circuit;
   receiving asynchronous output data from a second test register in the asynchronous circuit, the asynchronous output data resulting from application of the asynchronous input data to the asynchronous circuit; and
   converting the asynchronous output data to synchronous output data; and
   serially transmitting the synchronous output data to the synchronous test equipment;
   wherein transmission and reception of the asynchronous input and output data are synchronized at least in part with a clock signal associated with the synchronous test equipment, and wherein transmitting the asynchronous input data to the first test register comprises receiving the asynchronous input data with a shift register, and wherein receiving the asynchronous output data from a second test register comprises receiving the asynchronous output data with the shift register, and wherein receiving the asynchronous output data from a second test register further comprises transmitting the asynchronous output data serially from the second test register to a serial-to-parallel (S2P) register, and transmitting the asynchronous output data in parallel from the S2P register to the shift register.

23. The method of claim 22 wherein transmitting the asynchronous output data serially from the second test register to the S2P register is done via a serial tree interface coupled between the S2P register and the second test register.

24. A method for testing an asynchronous circuit using synchronous test equipment, comprising:
   converting synchronous input data received from the synchronous test equipment to asynchronous input data;
   transmitting the asynchronous input data to a first test register in the asynchronous circuit;
   receiving asynchronous output data from a second test register in the asynchronous circuit, the asynchronous output data resulting from application of the asynchronous input data to the asynchronous circuit; and
   converting the asynchronous output data to synchronous output data; and
   serially transmitting the synchronous output data to the synchronous test equipment;
   wherein transmission and reception of the asynchronous input and output data are synchronized at least in part with a clock signal associated with the synchronous test equipment, and wherein transmitting the asynchronous input data to the first test register comprises receiving the asynchronous input data with a shift register, and wherein receiving the asynchronous output data from a second test register comprises receiving the asynchronous output data with the shift register, and wherein receiving the asynchronous input data with the shift register comprises shifting in the asynchronous input data and shifting out previous asynchronous output data, the method further comprising commencing shifting the previous asynchronous output data out of the shift register before commencement of shifting the asynchronous input data into the shift register.

25. The method of claim 24 wherein commencing shifting of the previous asynchronous output data and subsequent shifting of the asynchronous input data results in a portion of the asynchronous input data being shifted out of the shift register, the method further comprising discarding the portion of the asynchronous input data.

26. The method of claim 25 further comprising merging the portion of the asynchronous input data with a remainder of the asynchronous input data for transmission to the first test register.

27. A method for testing an asynchronous circuit using synchronous test equipment, comprising:
   converting synchronous input data received from the synchronous test equipment to asynchronous input data;
   transmitting the asynchronous input data to a first test register in the asynchronous circuit;
   receiving asynchronous output data from a second test register in the asynchronous circuit, the asynchronous output data resulting from application of the asynchronous input data to the asynchronous circuit; and
   converting the asynchronous output data to synchronous output data; and
   serially transmitting the synchronous output data to the synchronous test equipment;
   wherein transmission and reception of the asynchronous input and output data are synchronized at least in part with a clock signal associated with the synchronous test equipment, and wherein transmitting the asynchronous input data to the first test register comprises receiving the asynchronous input data with a shift register, and wherein receiving the asynchronous output data from a second test register comprises receiving the asynchronous output data with the shift register, and wherein receiving the asynchronous input data with the shift register comprises shifting in the asynchronous input data and shifting out previous asynchronous output data, and wherein transmitting the asynchronous input data to the first test register is done in response to a control bit in the asynchronous input data indicating readiness of an interface associated with the first test register to receive the asynchronous input data.

28. A method for testing an asynchronous circuit using synchronous test equipment, comprising:
   converting synchronous input data received from the synchronous test equipment to asynchronous input data;
   transmitting the asynchronous input data to a first test register in the asynchronous circuit;
   receiving asynchronous output data from a second test register in the asynchronous circuit, the asynchronous output data resulting from application of the asynchronous input data to the asynchronous circuit; and
   converting the asynchronous output data to synchronous output data; and
   serially transmitting the synchronous output data to the synchronous test equipment;
   wherein transmission and reception of the asynchronous input and output data are synchronized at least in part with a clock signal associated with the synchronous test equipment, and wherein transmitting the asynchronous input data to the first test register comprises receiving the asynchronous input data with a shift register, and wherein receiving the asynchronous output data from a second test register comprises receiving the asynchronous output data with the shift register, and wherein receiving the asynchronous input data with the shift register comprises shifting in the asynchronous input data and shifting out previous asynchronous output data, and wherein receiving the asynchronous output data from the second test register is done in response to a control bit in the asynchronous output data indicating validity of the asynchronous output data.

* * * * *

UNITED STATES PATENT AND TRADEMARK OFFICE
CERTIFICATE OF CORRECTION

PATENT NO. : 7,260,753 B2 Page 1 of 1
APPLICATION NO. : 10/628074
DATED : August 21, 2007
INVENTOR(S) : Moacanin et al.

It is certified that error appears in the above-identified patent and that said Letters Patent is hereby corrected as shown below:

Column 12:

In line 7 of claim 20, change "circiut" to --circuit--.

Signed and Sealed this

Twenty-ninth Day of July, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,260,753 B2 | Page 1 of 1 |
| APPLICATION NO. | : 10/628074 | |
| DATED | : August 21, 2007 | |
| INVENTOR(S) | : Moacanin et al. | |

It is certified that error appears in the above-identified patent and that said Letters Patent is hereby corrected as shown below:

Column 12:

Claim 20, line 40, change "circiut" to --circuit--.

This certificate supersedes the Certificate of Correction issued July 29, 2008.

Signed and Sealed this

Twenty-sixth Day of August, 2008

JON W. DUDAS
*Director of the United States Patent and Trademark Office*